(12) United States Patent
Sako

(10) Patent No.: US 7,646,659 B2
(45) Date of Patent: *Jan. 12, 2010

(54) SEMICONDUCTOR DEVICE TEMPERATURE SENSOR AND SEMICONDUCTOR STORAGE DEVICE

(75) Inventor: Atsumasa Sako, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/350,667

(22) Filed: Jan. 8, 2009

(65) Prior Publication Data

US 2009/0116539 A1 May 7, 2009

Related U.S. Application Data

(63) Continuation of application No. 11/542,139, filed on Oct. 4, 2006, now Pat. No. 7,492,657, which is a continuation of application No. PCT/JP2004/008630, filed on Jun. 18, 2004.

(51) Int. Cl.
*G11C 11/34* (2006.01)
(52) U.S. Cl. .................. 365/212; 365/222; 365/189.09
(58) Field of Classification Search ................. 365/212, 365/222, 189.09
See application file for complete search history.

(56) References Cited

U.S. PATENT DOCUMENTS

| | | | |
|---|---|---|---|
| 6,304,148 B1 | 10/2001 | Nomura et al. | |
| 6,442,500 B1 | 8/2002 | Kim | |
| 7,106,112 B2* | 9/2006 | Jang | 327/143 |
| 7,107,178 B2* | 9/2006 | Won et al. | 702/130 |
| 7,196,956 B2 | 3/2007 | Shirota et al. | |
| 7,214,910 B2* | 5/2007 | Chen et al. | 219/494 |
| 7,295,484 B2* | 11/2007 | Cruz et al. | 365/222 |
| 7,324,398 B2 | 1/2008 | Shim et al. | |
| 7,493,531 B2* | 2/2009 | Ito et al. | 714/708 |
| 7,539,050 B2* | 5/2009 | Philipp et al. | 365/163 |
| 7,545,696 B2* | 6/2009 | Yamaoka | 365/211 |
| 7,554,869 B2* | 6/2009 | Kim et al. | 365/211 |
| 2003/0081484 A1 | 5/2003 | Kobayashi et al. | |
| 2003/0185031 A1 | 10/2003 | Hagura et al. | |
| 2003/0218931 A1 | 11/2003 | Okamoto et al. | |
| 2007/0247944 A1 | 10/2007 | Fisher et al. | |
| 2007/0268766 A1 | 11/2007 | Mori | |
| 2007/0274147 A1 | 11/2007 | Egerer | |
| 2008/0159038 A1 | 7/2008 | Jeong et al. | |

FOREIGN PATENT DOCUMENTS

| | | |
|---|---|---|
| JP | 05-307882 A | 11/1993 |
| JP | 11-088127 A | 3/1999 |
| JP | 2000-055742 A | 2/2000 |
| JP | 2000-074748 A | 3/2000 |
| JP | 2003-132678 A | 5/2003 |
| JP | 2003-288786 A | 10/2003 |
| JP | 2003-338177 A | 11/2003 |

* cited by examiner

*Primary Examiner*—Tuan T. Nguyen
(74) *Attorney, Agent, or Firm*—Arent Fox LLP

(57) ABSTRACT

A semiconductor device temperature sensor produces a reference level for temperature detection from two or more reference levels of different temperatures to detect a temperature. The temperature sensor is applied for detecting the temperature of a semiconductor storage device having a memory unit which requires a refresh action. A refresh cycle control circuit provided in the semiconductor storage device controls the cycle of the refresh action for the memory unit in response to an output of the temperature sensor.

13 Claims, 15 Drawing Sheets

SEMICONDUCTOR DEVICE TEMPERATURE SENSOR AND SEMICONDUCTOR STORAGE DEVICE

CROSS-REFERENCE TO RELATED APPLICATION

This application is a continuation of U.S. application Ser. No. 11/542,139, filed on Oct. 4, 2006 which is a continuation application and is based upon PCT/JP04/08630, filed on Jun. 18, 2004.

BACKGROUND OF THE INVENTION

1. Field of the Invention

The present invention relates to a semiconductor device temperature sensor and a semiconductor storage device and, more particularly, to a temperature sensor for a semiconductor storage device which needs a refresh action in order for a DRAM or the like to hold data.

2. Description of the Related Art

Conventionally, for example, a SRAM (Static Random Access Memory) has been used as a semiconductor storage device (memory) for portable systems including cellular phones. However, the required memory capacity tends to increase with e.g. improvement of the function of portable systems from year to year. Therefore, a DRAM (Dynamic Random Access Memory), which is a memory of large capacity, is going into use as a memory for portable systems. Then, the life time of a battery for portable systems becomes a subject.

The SRAM hardly consumes electric power for holding data, whereas the DRAM needs a refresh action on a regular basis to hold data and therefore it consumes a certain degree of electric power even when it is in a standby condition. In other words, with just holding data, a portable system with a DRAM adopted as a memory consumes electric power and decreases the capacity of a battery thereof even when it is not used actually.

To alleviate the decrease in battery capacity in such standby condition, an electric current consumption may be cut down by reducing the number of refresh actions of the DRAM in the standby condition. Concretely, for example, the DRAM has a characteristic such that the lower the temperature is, the longer the data-holding time is. Therefore, when the temperature of the DRAM is lower than a certain boundary temperature, the cycle of refresh actions (or time interval of refresh actions) may be set so as to be longer than that in a higher temperature condition thereby to reduce the number of refresh actions.

Incidentally, in the past there has been proposed a semiconductor storage device including: a refresh control circuit which switches the cycle of refresh actions of a memory cell; and a temperature-detecting unit which is biased with a bias voltage from a voltage-biasing unit including a reference unit and a regulator unit (refer, for example, to Patent Document 1). The semiconductor storage device is arranged so that it switches the control of the refresh control circuit in response to the detection of a predetermined temperature by the temperature-detecting part, and forces the control circuit to implement a refresh action of a short cycle in a high-temperature region and forces the control circuit to implement a refresh action of a long cycle in a low-temperature region, whereby the electric current consumption in the low-temperature region is reduced while the data-holding characteristic of the memory cell is maintained throughout a whole temperature range.

Further, in the past there has been proposed a programmable temperature sensor including: a programmable temperature-sensing unit which generates a forward sensing signal and a backward sensing signal, whose voltage levels depend on amounts of electric currents passing through a forward current source and a backward current source; and a comparator which compares the forward sensing signal and backward sensing signal in voltage level to generate a temperature information signal (refer, for example, to Patent Document 2). The programmable temperature sensor is arranged so that magnitudes of voltage levels of the forward sensing signal and backward sensing signal can be permutated at a predetermined critical temperature, which makes it possible to adjust the critical temperature from the outside.

Patent Document 1

Japanese Unexamined Patent Publication (Kokai) No. 2003-132678

Patent Document 2

Japanese Unexamined Patent Publication (Kokai) No. 2000-074748.

The prior art semiconductor device temperature sensor and semiconductor storage device and their problems will be described later in detail with reference to accompanying drawings.

SUMMARY OF THE INVENTION

An object of the invention is to provide a semiconductor device temperature sensor with the accuracy of temperature detection improved. Further, another object of the invention is to provide a semiconductor storage device, which is arranged by application of a highly accurate temperature sensor so that it can appropriately control the cycle of the refresh action and reduce the electric power consumption.

According to a first aspect of the present invention, there is provided a semiconductor device temperature sensor performing temperature detection by producing a reference level for temperature detection from two or more reference levels of different temperatures.

According to a second aspect of the present invention, there is provided a semiconductor storage device having a memory unit which requires a refresh action, comprising a temperature sensor, detecting a temperature of the semiconductor storage device; and a refresh cycle control circuit, controlling a cycle of the refresh action for the memory unit in response to an output of the temperature sensor, wherein the temperature sensor produces a reference level for temperature detection from two or more reference levels of different temperatures to detect the temperature of the semiconductor storage device.

DESCRIPTION OF THE PREFERRED EMBODIMENTS

Before describing embodiments of a semiconductor device temperature sensor and a semiconductor storage device according to the present invention, a semiconductor device temperature sensor and a semiconductor storage device of a prior art and their associated problems will be described in detail with reference to the accompanying drawings (FIGS. 1 to 12).

Figure 1:
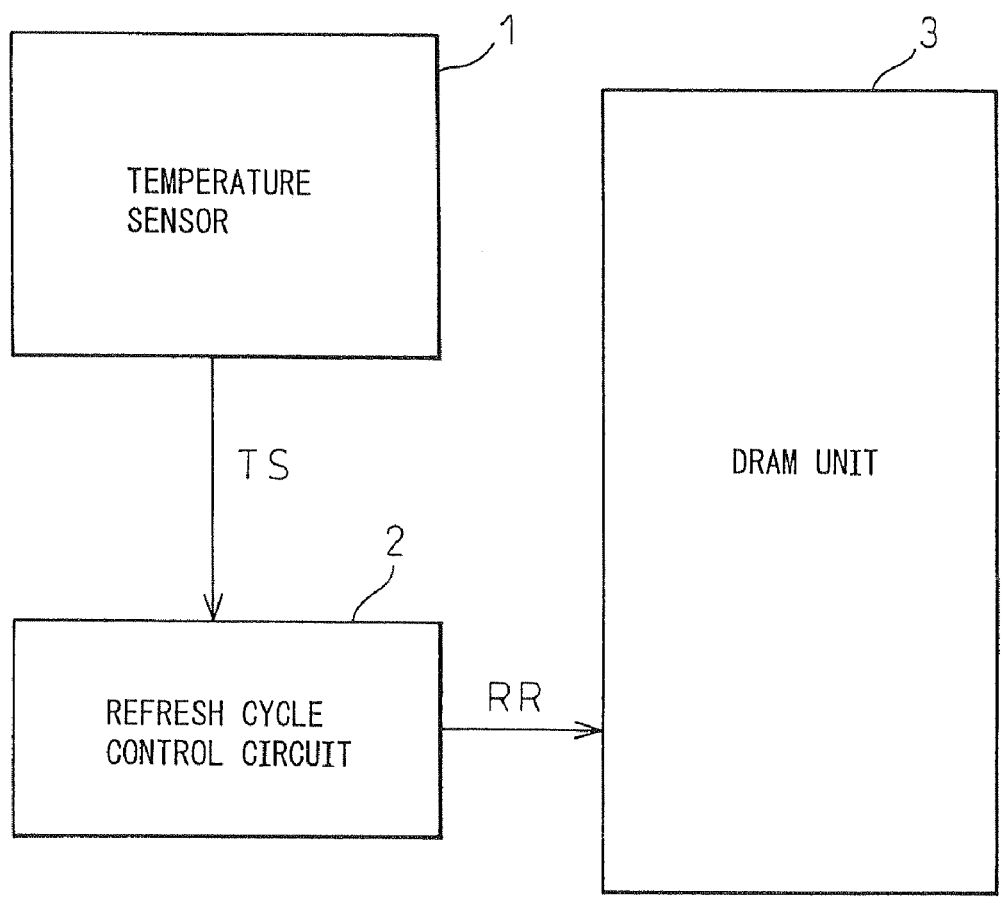
FIG. 1 is a block diagram conceptually showing an important portion of a DRAM as an example of a semiconductor device, in which a temperature sensor is applied.

FIG. 1 is a block diagram conceptually showing an important portion of a DRAM (semiconductor storage device) as an example of a semiconductor device, in which a temperature sensor is applied. In FIG. 1, the reference character 1 shows a temperature sensor, 2 shows a refresh cycle control circuit, and 3 shows a DRAM part.

The DRAM unit 3 includes a memory unit which needs a refresh action. The temperature sensor 1 detects the temperature of the DRAM unit 3 and outputs a detected temperature signal TS to the refresh cycle control circuit 2. Then, the refresh cycle control circuit 2 outputs a refresh request signal RR to the DRAM unit 3 in response to the detected temperature signal TS from the temperature sensor 1 and controls the cycle of the refresh action in the DRAM unit 3 (memory unit).

Figure 2:
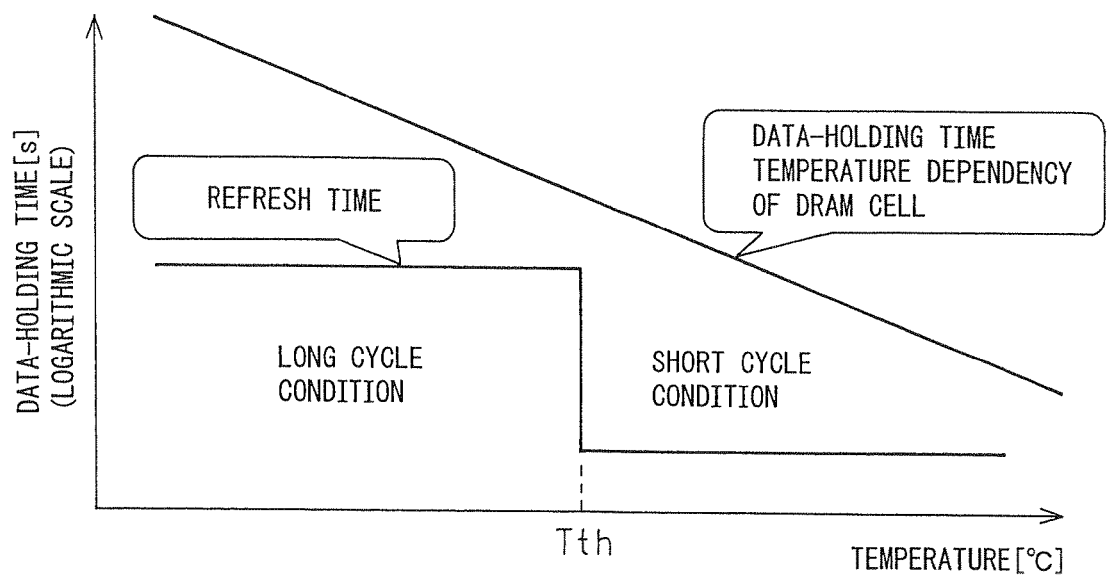
FIG. 2 is a diagram explaining the temperature dependency of data-holding time of a memory cell in the DRAM shown in FIG. 1.

FIG. 2 is a diagram explaining the temperature dependency of data-holding time of a memory cell in the DRAM shown in FIG. 1.

As shown in FIG. 2, with the memory cell of a DRAM, for example, the lower the temperature is, the longer the data-holding time is, and conversely the higher the temperature is, the shorter the data-holding time is. Hence, FIG. 2 shows, under the condition where the temperature $T_{th}$ making a threshold is set, the way to elongate the cycle of the refresh action when the temperature of the semiconductor device (semiconductor storage device: DRAM) is lower than the preset temperature $T_{th}$ and shorten the cycle of the refresh action when the temperature of the DRAM is higher than the preset temperature $T_{th}$.

Figure 3:
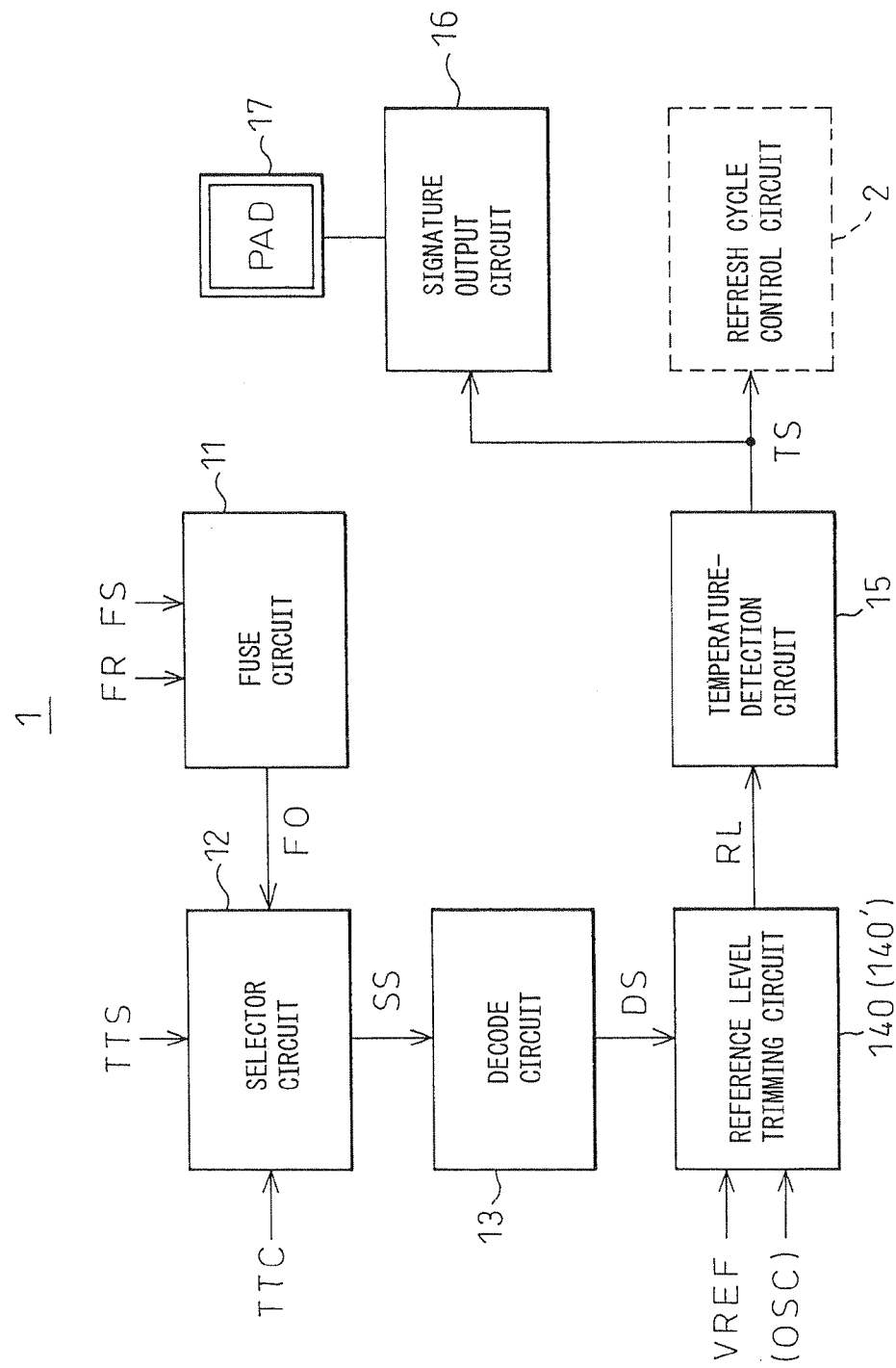
FIG. 3 is a block diagram schematically showing an example of a conventional semiconductor device temperature sensor.

FIG. 3 is a block diagram schematically showing an example of a conventional semiconductor device temperature sensor.

As shown in FIG. 3, the temperature sensor 1 is intended to, for example, supply a detected temperature signal TS showing a detected temperature to the refresh cycle control circuit 2 for the DRAM, and includes a signature output circuit 16 connected to a pad 17, a fuse circuit 11, a selector circuit 12, a decode circuit 13, a reference level trimming circuit 140 and a temperature-detection circuit 15.

The temperature sensor 1 is arranged, for example, so as to adjust variations in detected temperatures of the temperature sensor owing to manufacturing variations, etc. in a test step. Specifically, the temperature sensor 1 is arranged so that the temperature of the chip (DRAM) is set to a temperature for detection, and the reference level RL that the reference level trimming circuit 140 provides for the temperature-detection circuit 15 is subjected to trimming.

Figure 4:
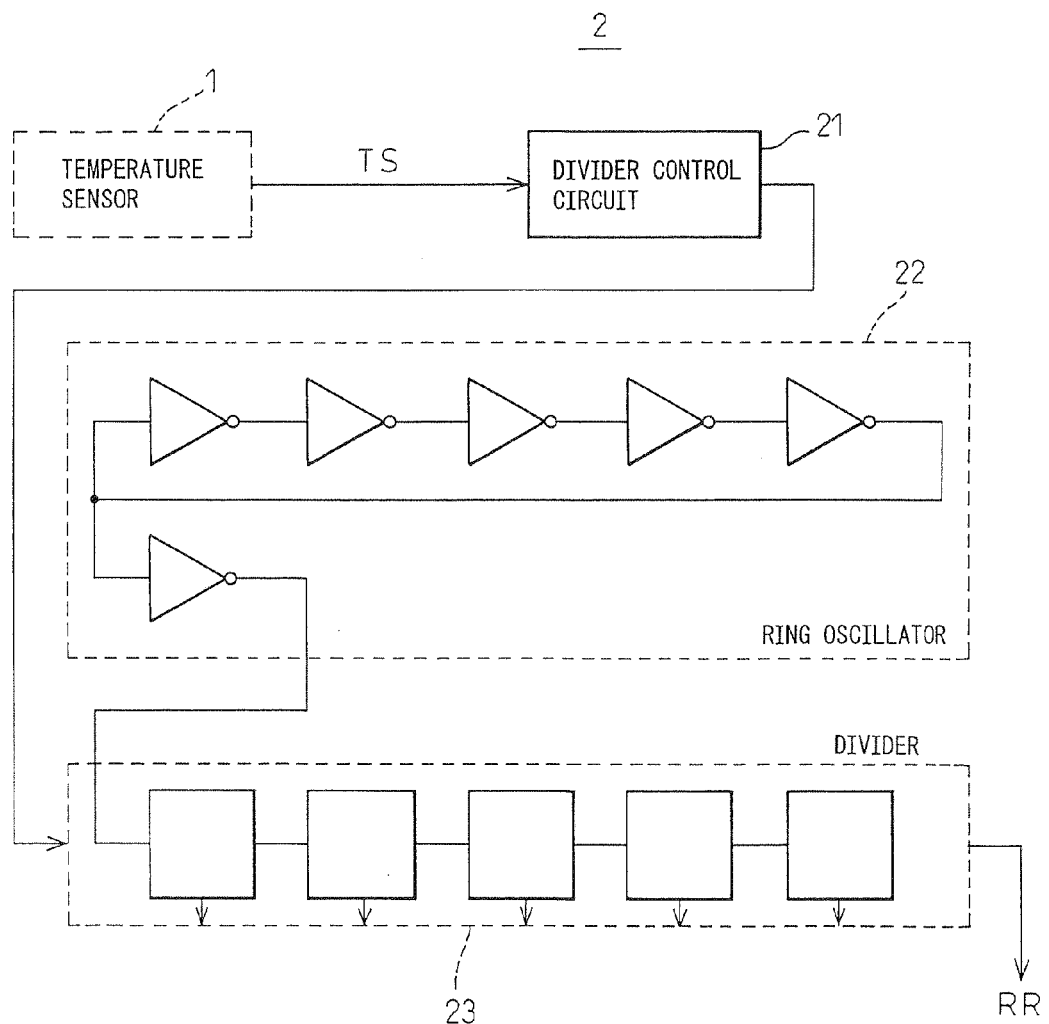
FIG. 4 is a block diagram showing an example of a refresh cycle control circuit in the DRAM shown in FIG. 1.

FIG. 4 is a block diagram showing an example of a refresh cycle control circuit in the DRAM shown in FIG. 1.

As shown in FIG. 4, the refresh cycle control circuit 2 is intended to receive the detected temperature signal TS from the temperature sensor 1 to execute the refresh action with a cycle corresponding to the temperature of the chip, and it includes a divider control circuit 21, a ring oscillator 22 and a divider 23.

The divider control circuit 21 selects an output from a predetermined dividing stage of the divider 23 in response to the detected temperature signal TS from the temperature sensor 1 and outputs the result as a refresh request signal RR. Specifically, an output from a longer cycle (lower frequency) dividing stage is selected when the detected temperature is lower, and conversely an output from a shorter cycle (higher frequency) dividing stage is selected when the detected temperature is higher. Incidentally, when a refresh request signal RR from the refresh cycle control circuit 2 is supplied to the DRAM unit 3, the refresh action is executed with a cycle corresponding to the temperature of the DRAM.

Figure 5:
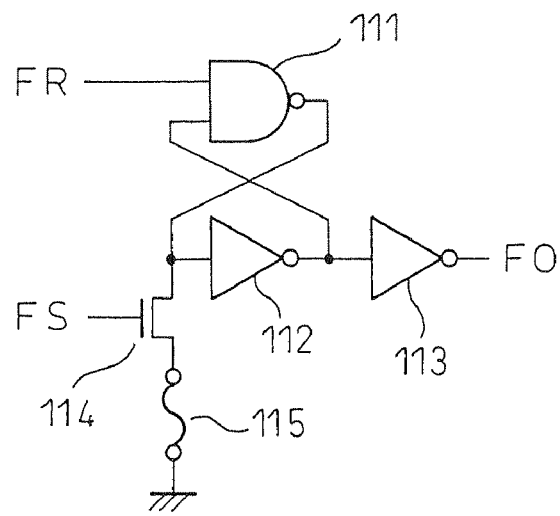
FIG. 5 is a circuit diagram showing an example of a fuse circuit in the temperature sensor shown in FIG. 3.

FIG. 5 is a circuit diagram showing an example of a fuse circuit in the temperature sensor shown in FIG. 3.

As shown in FIG. 5, the fuse circuit 11 includes e.g. a NAND gate 111, inverters 112 and 113, an n-channel MOS transistor (nMOS transistor) 114 and a fuse 115.

A fuse reset signal FR is supplied to one input of the NAND gate 111, and a fuse set signal FS is supplied to a gate of the nMOS transistor 114. The other input of the NAND gate 111 and an output thereof are cross-connected to an output of the inverter 112 and an input thereof, whereby a latch is configured.

The fuse-reset signal FR is for resetting an output signal FO of the fuse circuit 11. The output signal FO of the fuse circuit 11 is kept at High level "H" by providing a fuse reset signal FR at Low level "L." The transistor 114 is turned on by providing the gate of the transistor 114 with a fuse set signal FS at H level "H," and then the fuse circuit 11 outputs an output signal FO at a level adapted to the state of the fuse 115.

In other words, making High level "H" of the fuse set signal FS turns on the transistor 114. At that time, if the fuse 115 has not been cut by fusion, the input of the inverter 112 is made Low level "L" and then an output signal FO at Low level "L" is output from the fuse circuit 11, and if the fuse 115 has been cut by fusion, the input of the inverter 112 remains at High level "H" and the output signal FO at High level "H" is output from the fuse circuit 11 as it is.

Figure 6:
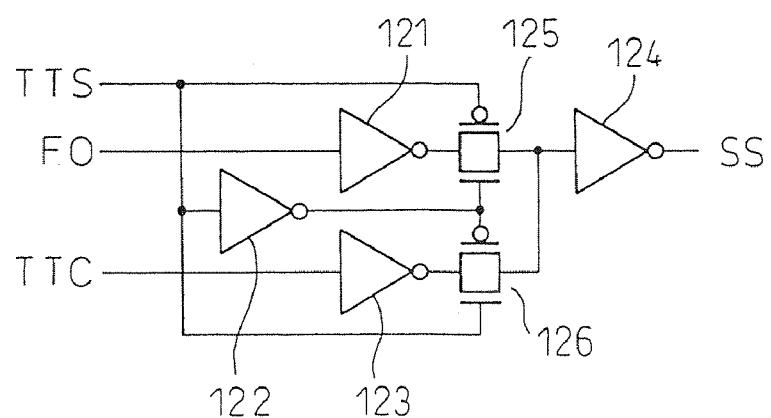
FIG. 6 is a circuit diagram showing an example of a selector circuit in the temperature sensor shown in FIG. 3.

FIG. 6 is a circuit diagram showing an example of a selector circuit in the temperature sensor shown in FIG. 3.

As shown in FIG. 6, the selector circuit 12 includes inverters 121-124, and transfer gates 125 and 126 which are constituted by pMOS and nMOS transistors. To the selector circuit 12, a test code TTC for a trimming test, an output signal FO from the fuse circuit 11, and a temperature-detection trimming test mode switching signal TTS are input from the outside.

First, when the temperature-detection trimming test mode switching signal TTS is at Low level "L," the transfer gate 125 is turned on and the transfer gate 126 is turned off. Then, the output signal FO of the fuse circuit is output through the inverter 121, transfer gate 125 and inverter 124 as a trimming selection signal SS. When the temperature-detection trimming test mode switching signal TTS is at High level "H," the transfer gate 125 is turned off and the transfer gate 126 is turned on, and therefore the test code TTC for a trimming test is output through the inverter 123, transfer gate 126 and inverter 124 as a trimming selection signal SS.

Specifically, the selector circuit 12 selects a temperature-detection trimming test mode according to the temperature-detection trimming test mode switching signal TTS (TTS is at High level "H") thereby to switch the fuse output FO to the test code TTC and output the test code TTC as a trimming selection signal SS. The trimming selection signal SS is input to the decode circuit 12, making a trimming decode signal.

Figure 7:
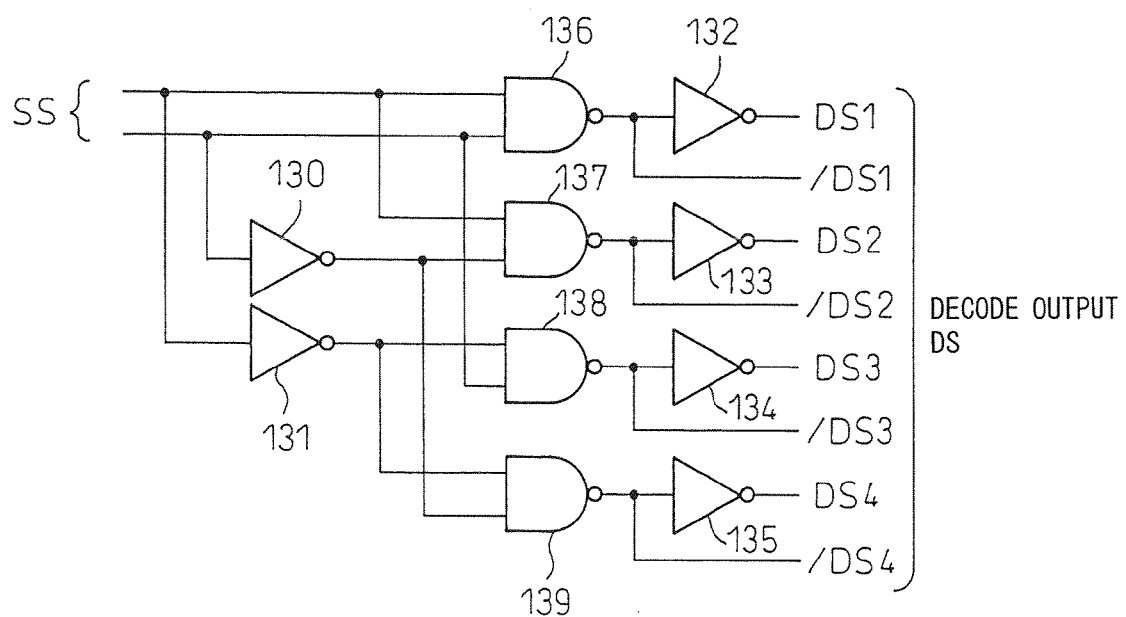
FIG. 7 is a circuit diagram showing an example of a decode circuit in the temperature sensor shown in FIG. 3.

FIG. 7 is a circuit diagram showing an example of a decode circuit in the temperature sensor shown in FIG. 3. The decode circuit 13 shown in FIG. 7 includes inverters 130-135, NAND gates 136-139, and is arranged so that it decodes a two-bit trimming selection signal SS to output four pairs of complementary decode outputs: DS1 and /DS1; DS2 and /DS2; DS3 and /DS3; and DS4 and /DS4 (trimming decode signals DS). Now, it is needless to say that the number of bits of the trimming selection signal SS, the configuration of the decode circuit 13, etc. may be changed in various ways.

Figure 8:
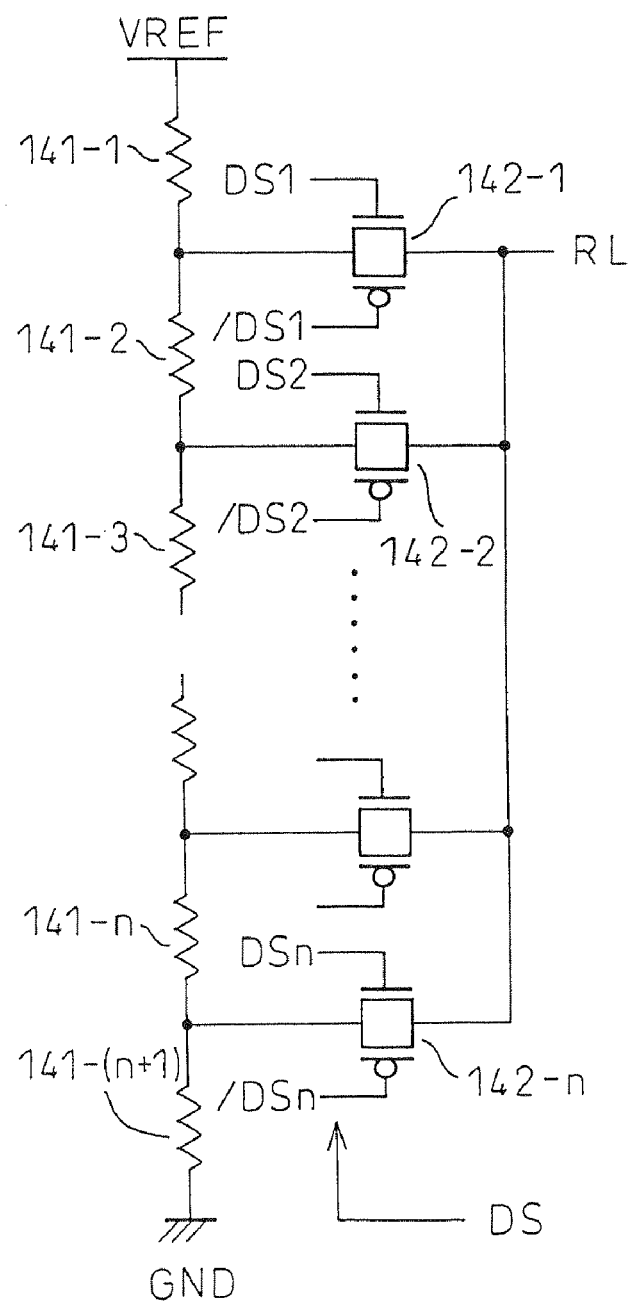
FIG. 8 is a circuit diagram showing an example of a reference level trimming circuit in the temperature sensor shown in FIG. 3.

FIG. 8 is a circuit diagram showing an example of a reference level trimming circuit in the temperature sensor shown in FIG. 3.

As shown in FIG. 8, the reference level trimming circuit 140 includes resistors 141-1, 141-2, . . . , 141-n, 141-(n+1) and transfer gates 142-1, 142-2, . . . , 142-n, and is arranged so that it selects any one of the transfer gates 142-1, 142-2, . . . , 142-n according to trimming decode signals DS (n pairs of complementary decode outputs DS1 and /DS1, DS2 and /DS2, . . . , and DSn and /DSn) to output a voltage level with respect to the division resistance corresponding to the selected transfer gate as a reference level RL. Incidentally, while in FIG. 8 the voltage level of the reference level RL is controlled according to n pairs of complementary decode outputs (DS1 and /DS1, DS2 and /DS2, . . . , and DSn and /DSn), in the case of using four pairs of complementary decode outputs DS1 and /DS1, DS2 and /DS2, DS3 and /DS3, and DS4 and /DS4 like the decode circuit 13 shown in FIG. 7, for example, the number of transfer gates is four.

Figure 9:
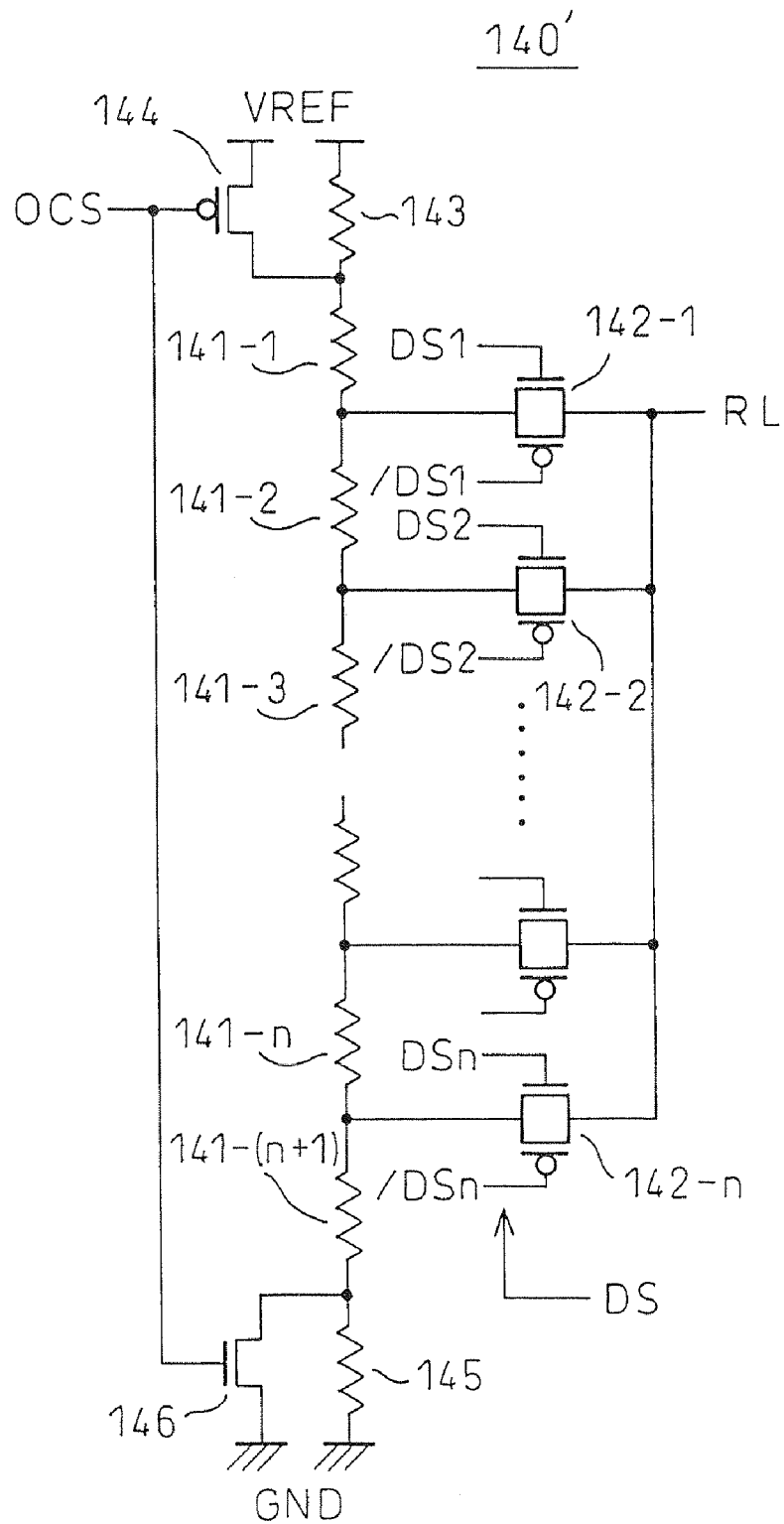
FIG. 9 is a circuit diagram showing another example of the reference level trimming circuit in the temperature sensor shown in FIG. 3.

FIG. 9 is a circuit diagram showing another example of the reference level trimming circuit in the temperature sensor shown in FIG. 3.

As clear from the comparison between FIGS. 9 and 8, the reference level trimming circuit 140' shown in FIG. 9 is the reference level trimming circuit 140 of FIG. 8 having a resistor 143 and a pMOS transistor 144, which are connected in parallel between a reference level (source line VREF) and the resistor 141-1, and a resistor 145 and an nMOS transistor 146, which are connected in parallel between a ground line (GND) and the resistor 141-(n+1).

The gates of the PMOS transistor 144 and nMOS transistor 146 are supplied with an offset control signal OSC, and the reference level RL can be shifted to the side of Low level by changing the offset control signal OSC from Low level "L" to High level "H."

Figure 10:
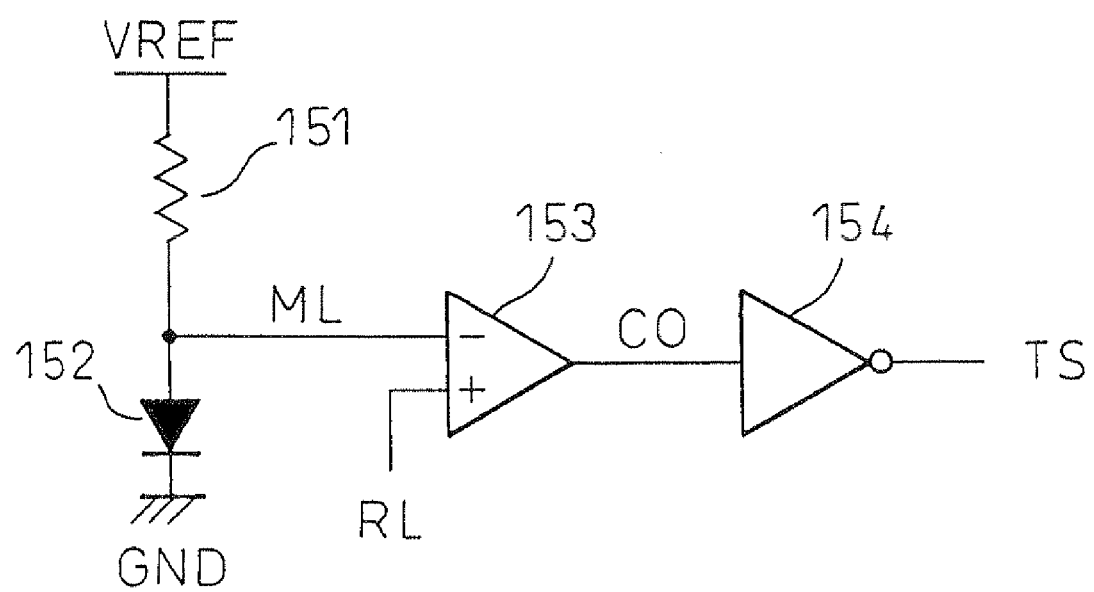
FIG. 10 is a circuit diagram showing an example of a temperature-detection circuit in the temperature sensor shown in FIG. 3.

FIG. 10 is a circuit diagram showing an example of a temperature-detection circuit in the temperature sensor shown in FIG. 3.

As shown in FIG. 10, the temperature-detection circuit 15 includes a resistor 151, a diode 152, a differential amplifier 153 and an inverter 154. The differential amplifier 153 makes a comparison of the reference level RL and a monitor level ML offered by a resistor 151 and diode 152 connected in series between the reference level (VREF) and the ground line (GND) and outputs a detected temperature signal TS through the inverter 154.

Figure 11:
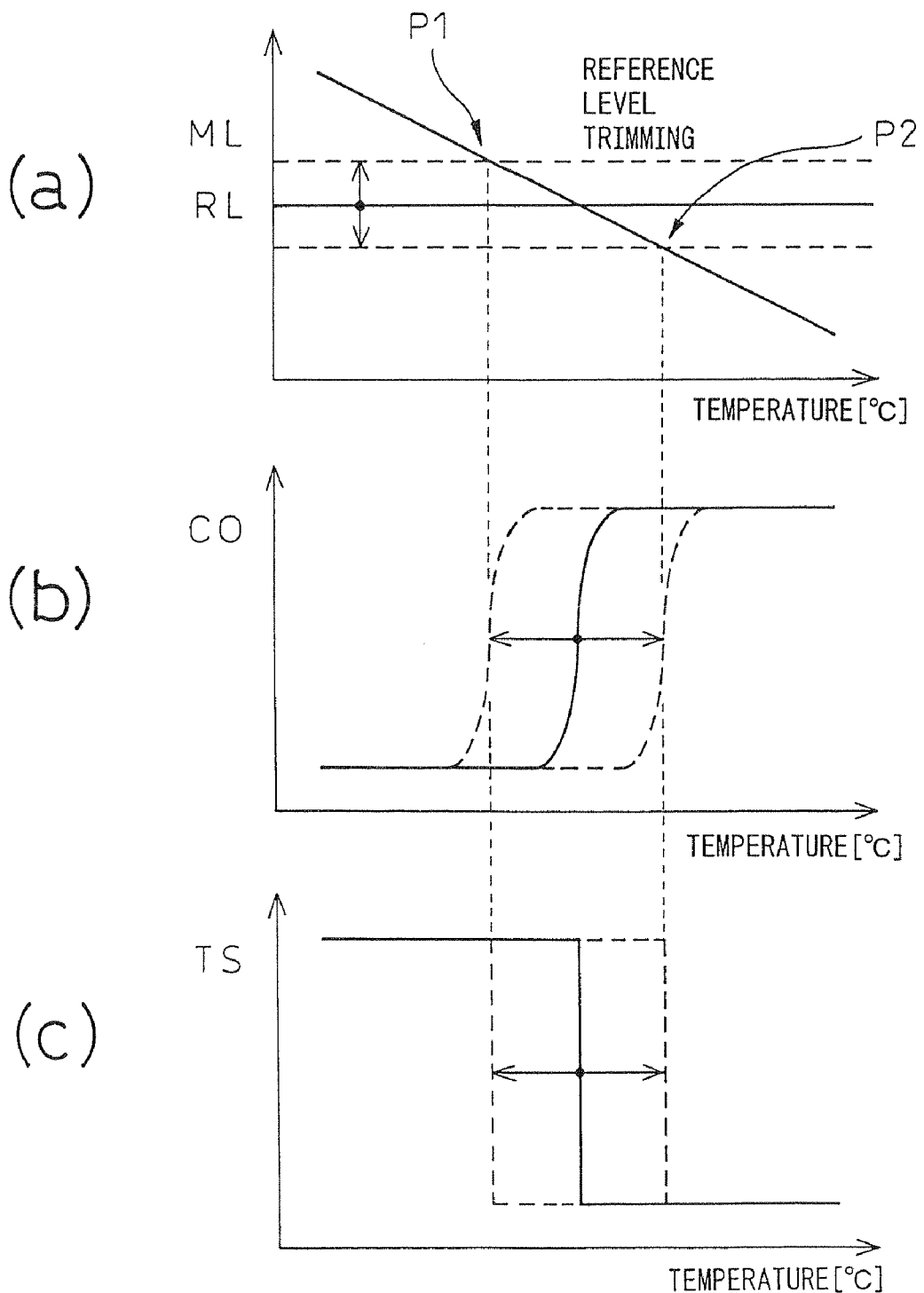
FIG. 11 is a diagram explaining an action of the temperature-detection circuit shown in FIG. 10.

FIG. 11 is a diagram explaining an action of the temperature-detection circuit shown in FIG. 10.

The differential amplifier 153 makes a comparison of the monitor level ML and reference level RL from the reference level trimming circuit 140 (140') utilizing the change in characteristic of the diode 152 owing to the change in the temperature of the chip. Concretely, when the monitor level ML is above the reference level RL (e.g. P1 in FIG. 11(a)), i.e. when the actual temperature of the chip is lower than the preset temperature, the output signal CO of the differential amplifier 153 is made Low level "L" (see FIG. 11(b)), and the detected temperature signal TS is made High level "H" (see FIG. 11(c)). Conversely, when the monitor level ML is below the reference level RL (e.g. P2 in FIG. 11(a)), i.e. when the actual temperature of the chip is higher than the preset temperature, the output signal CO of the differential amplifier 153 is made High level "L" (see FIG. 11(b)), and the detected temperature signal TS is made Low level "L" (see FIG. 11(c)).

The detected temperature signal TS is supplied to the refresh cycle control circuit 2 and concurrently, made to pass through the signature output circuit 16 and taken out of the pad 17.

Figure 12:
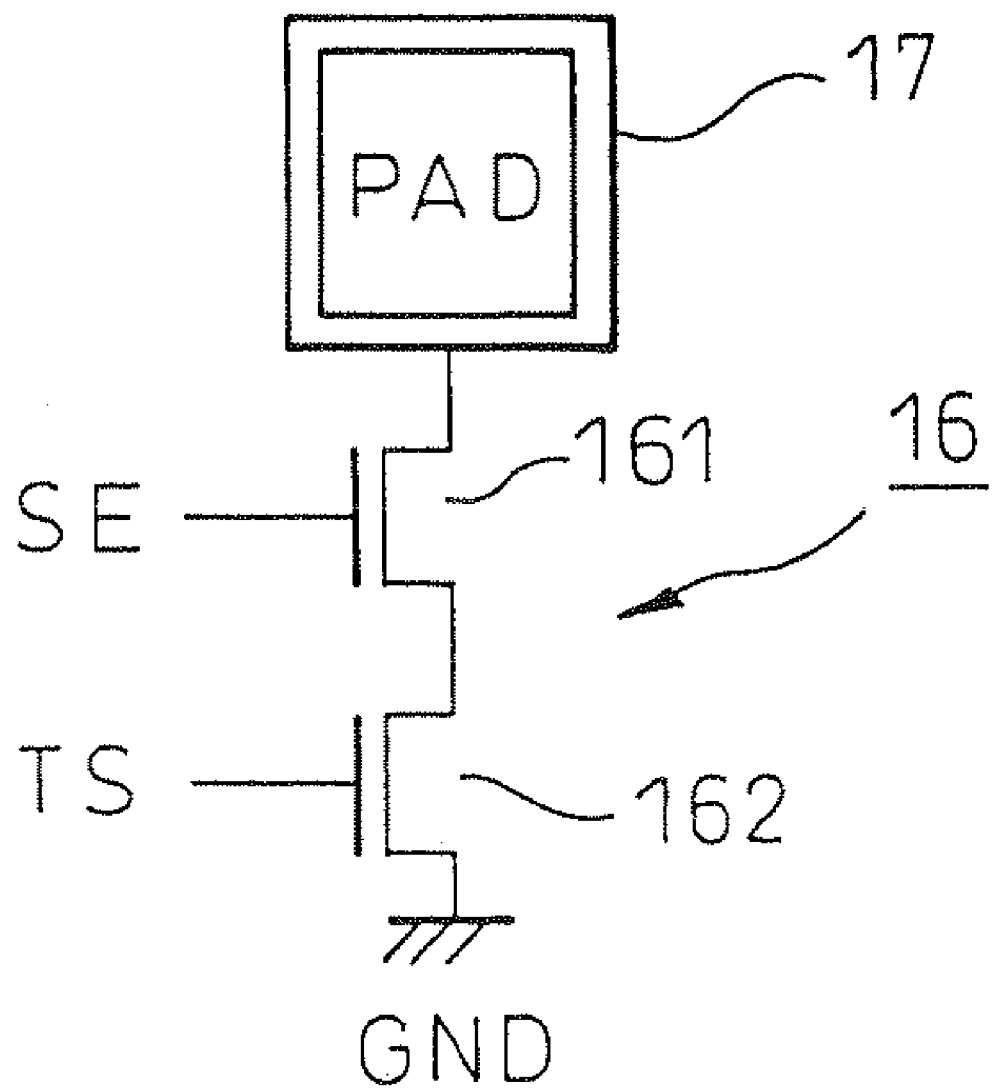
FIG. 12 is a circuit diagram showing an example of a signature output circuit in the temperature sensor shown in FIG. 3.

FIG. 12 is a circuit diagram showing an example of a signature output circuit in the temperature sensor shown in FIG. 3.

As shown in FIG. 12, the signature output circuit 16 includes: an nMOS transistor 161 whose gate is supplied with a signature enable signal SE; and an nMOS transistor 162 whose gate is supplied with a detected temperature signal TS. If the actual temperature of the chip is lower than the preset temperature when the signature enable signal SE is at High level "H," a current will be output to the pad 17.

Now, the case where the circuit 140 shown in FIG. 8 is applied as a reference level trimming circuit will be described.

First, the temperature of the chip is set to a detected temperature of the temperature sensor 1. Then, the selector circuit 12 selects the temperature-detection trimming test mode thereby to switch the output signal FO of the fuse circuit to the test code TTC for a trimming test.

Thus, the test code TTC for a trimming test is input to the decode circuit 13, and the decode circuit 13 outputs a trimming decode signal DS. Then, using the trimming decode signal DS, the trimming of the reference level RL output from the reference level trimming circuit 140 can be performed.

The reference level RL is compared with the monitor level ML derived from the series connection of the diode 152 and resistor 151 in the temperature-detection circuit 15. When the monitor level ML is above the reference level RL, i.e. when the actual chip temperature is lower than the preset temperature, the detected temperature signal TS is made High level "H." Conversely, when the monitor level ML is below the reference level RL, i.e. when the actual chip temperature is higher than the preset temperature, the detected temperature signal TS is made Low level "L."

As for the detected temperature signal TS, if the actual chip temperature is lower than the preset temperature when the signature enable signal SE is made High level "H," the current thereof will be output to the pad 17. The ON/OFF switching point of the current is an intersecting point of the monitor level ML and reference level RL, which is a trimming correction point of the reference level trimming circuit 140. By cutting the fuse of the fuse circuit 11 by the test code TTC for a trimming test of this time, the offset correction of the preset temperature of the temperature-detection circuit 15 can be performed.

Further, the case where the circuit 140' shown in FIG. 9 is applied as a reference level trimming circuit will be described.

First, the chip temperature is set to a test temperature for a high temperature test (e.g. 90-100° C., approximately) and the offset control signal OCS of the reference level trimming circuit 140' is made High level "H," whereby the offset voltage is controlled so as to make the reference level RL from a reference level for the preset temperature of the temperature-detection circuit 15 to a reference level for the test temperature. Further, the selector circuit 12 selects the temperature-detection trimming test mode, whereby the output signal FO of the fuse circuit is switched to the test code TTC for a trimming test.

Thus, the test code TTC for a trimming test is input to the decode circuit 13, and the decode circuit 13 outputs a trimming decode signal DS. Then, using the trimming decode signal DS, the trimming of the reference level RL output from the reference level trimming circuit 1401 can be performed.

The reference level RL is compared with the monitor level ML derived from the series connection of the diode 152 and resistor 151 in the temperature-detection circuit 15. When the monitor level ML is above the reference level RL, namely when the actual chip temperature is lower than the preset temperature, the detected temperature signal TS is made High level "H." Conversely, when the monitor level ML is below the reference level RL, namely when the actual chip temperature is higher than the preset temperature, the detected temperature signal TS is made Low level "L."

As for the detected temperature signal TS, if the actual chip temperature is lower than the preset temperature when the signature enable signal SE is made High level "H," current will be output to the pad 17. The ON/OFF switching point of the current is an intersecting point of the monitor level ML and reference level RL, which is a trimming correction point of the reference level trimming circuit 140'. By cutting the fuse of the fuse circuit 11 by the test code TTC for a trimming test of this time, the offset correction of the preset temperature of the temperature-detection circuit 15 can be performed.

Further, in the case where the reference level trimming circuit 140' is applied, a detected temperature-adjusting offset voltage for adjustment of the difference between a test temperature during the test time for trimming test and a detected temperature during the time of normal operation is added by the offset control signal OSC supplied to the gates of the pMOS transistor 144 and nMOS transistor 146, which makes it possible to perform the trimming of the reference level at an arbitrary test temperature.

However, in the case where the circuit 140 shown in FIG. 8 is applied as the reference level trimming circuit, there is the problem of an increase in the test cost because the test step of taking a chip temperature as the detected temperature is added. Also, in the case where the circuit 140' shown in FIG. 9 is applied as the reference level trimming circuit, there is the problem of impossibility of handling the manufacturing variation of the offset itself for adjustment of the detected temperature.

Embodiments of a semiconductor device temperature sensor and a semiconductor storage device, which are associated with the invention, will be described below in detail with reference to the accompanying drawings.

Figure 13:
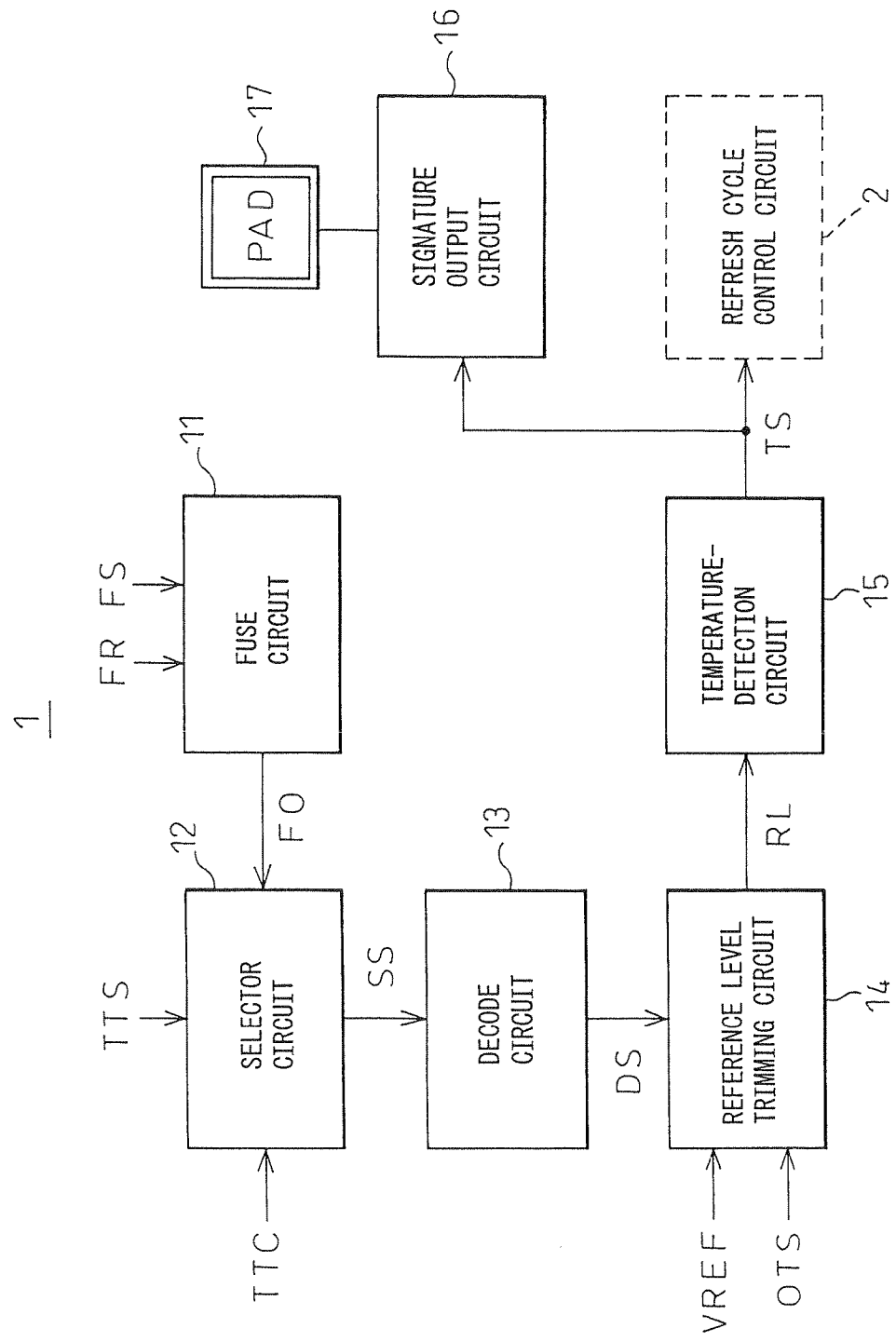
FIG. 13 is a block diagram schematically showing an embodiment of a semiconductor device temperature sensor in association with the invention.

FIG. 13 is block diagram schematically showing an embodiment of a semiconductor device temperature sensor in association with the invention. The temperature sensor 1 of this embodiment is intended to, for example, supply a detected temperature signal TS showing a detected temperature to the refresh cycle control circuit 2 for the DRAM like the temperature sensor shown in FIG. 3.

As is clear from the comparison between FIG. 13 and FIG. 3 described above, the temperature sensor 1 of this embodiment is configured by replacing the reference level trimming circuit 140 (140') in the temperature sensor shown in FIG. 3 with a reference level trimming circuit 14 which is supplied with a reference level VREF and an operation mode switching signal OTS. In the temperature sensor 1, the fuse circuit 11, selector circuit 12, decode circuit 13, temperature-detection circuit 15 and signature output circuit 16 connected to the pad 17 are substantially the same as those of the temperature sensor in FIG. 3.

Figure 14:
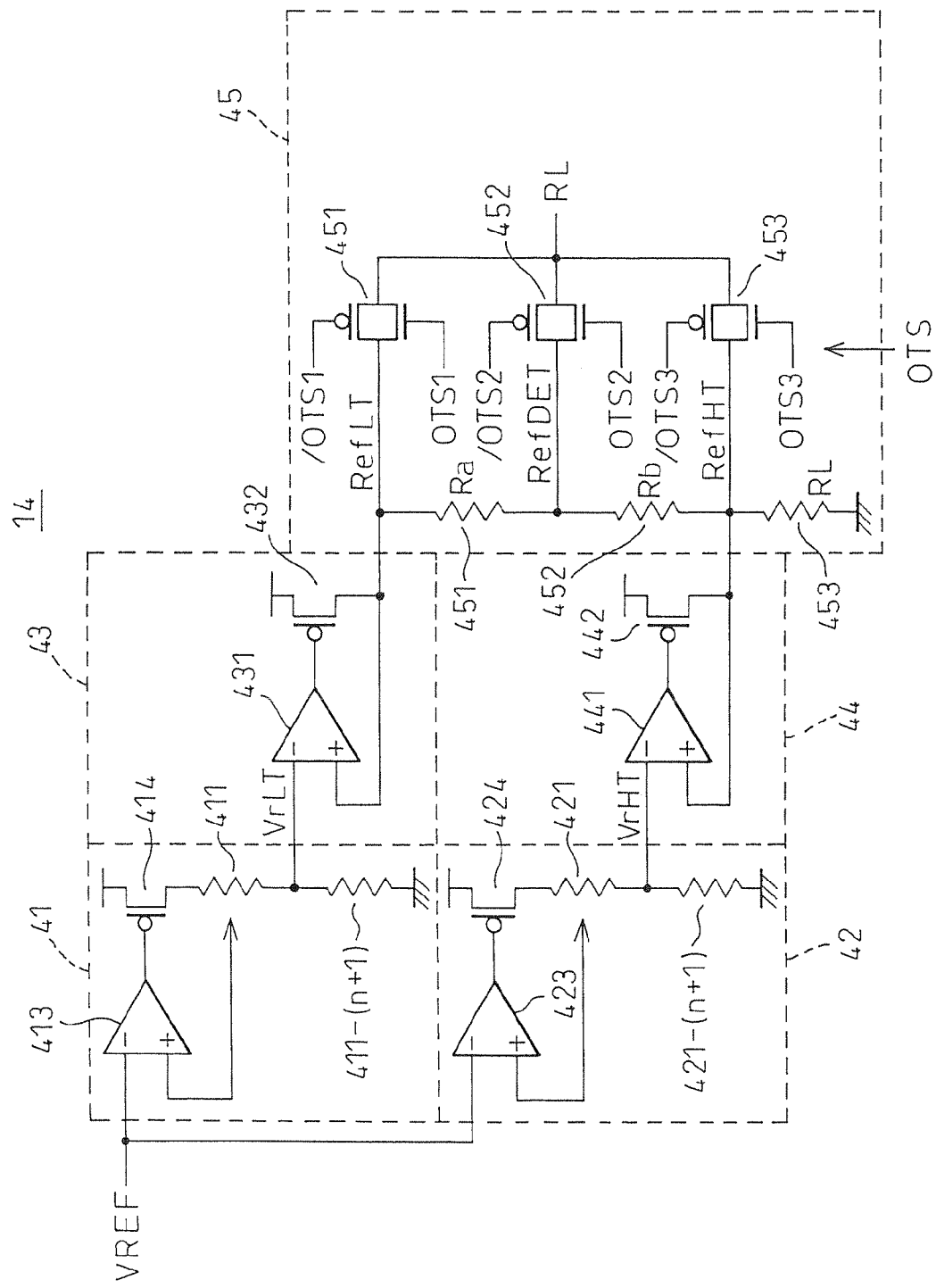
FIG. 14 is a circuit diagram showing an embodiment of a reference level trimming circuit in the temperature sensor shown in FIG. 13.

FIG. 14 is a circuit diagram showing an embodiment of the reference level trimming circuit in the temperature sensor shown in FIG. 13. In FIG. 14, the reference character 41 shows a low-temperature reference level trimming part, 42 shows a high-temperature reference level trimming part, 43 shows a low-temperature voltage follower, 44 shows a high-temperature voltage follower, and 45 shows a reference level switching part.

The low-temperature reference level trimming unit 41 and high-temperature reference level trimming unit 42 are similar in circuit configuration. The reference level trimming unit 41 (42) includes a differential amplifier 413(423), a pMOS transistor 414(424), a variable resistor 411(421) and a resistor 411-($n$+1)(421-($n$+1)).

Figure 15:
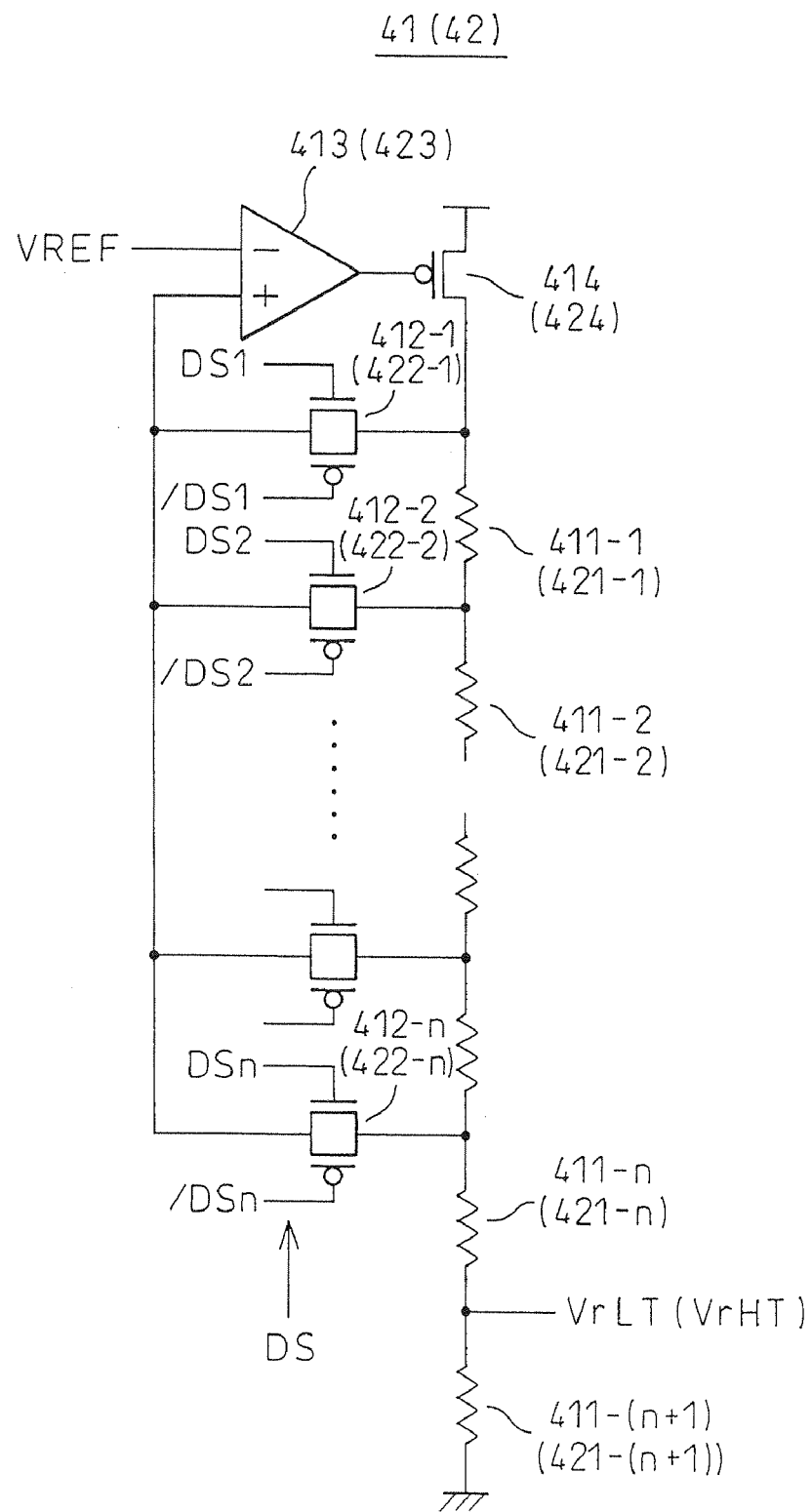
FIG. 15 is a circuit diagram showing an important portion of the reference level trimming circuit shown in FIG. 14.

FIG. 15 is a circuit diagram showing an important portion of the reference level trimming circuit shown in FIG. 14, which shows an example of each of the low-temperature reference level trimming unit 41 and high-temperature reference level trimming unit 42. Specifically, in the low-temperature reference level trimming unit 41 (high-temperature reference level trimming unit 42) in FIG. 14, the variable resistor 411 is composed of n resistors 411-1, 411-2, ..., and 411-$n$, and transfer gates 412-1, 412-2, ..., and 412-$n$; any one of the transfer gates 412-1, 412-2, ..., and 412-$n$ is selected according to trimming decode signals DS (n pairs of complementary decode outputs, DS1 and /DS1, DS2 and /DS2, ..., and DSn and /DSn) to supply a positive input of the differential amplifier 413 with a voltage level with respect to the division resistance corresponding to the selected transfer gate. Here, to a negative input of the differential amplifier 413 is supplied the reference level VREF, and an output signal of the differential amplifier 413 is supplied to a gate of the pMOS transistor 414. Incidentally, in FIG. 15, the voltage level of a signal supplied to the positive input of the differential amplifier 413 is controlled by n pairs of complementary decode outputs (DS1 and /DS1, DS2 and /DS2, ..., and DSn and /DSn). However, for example, in the case where four pairs of complementary decode outputs DS1 and /DS1, DS2 and /DS2, DS3 and /DS3, and DS4 and /DS4 are used as in the decode circuit 13 shown in FIG. 7, the number of the transfer gates is four.

Referring to FIG. 14 again, the low-temperature voltage follower 43 and high-temperature voltage follower 44 are similar in circuit configuration. The voltage follower 43 (44) includes a differential amplifier 431(441) and a pMOS transistor 432(442). The reference level switching unit 45 includes resistors Ra, Rb and RL and transfer gates 451-453. Out of the transfer gates 451, 452 and 453, arbitrary one is selected according to complementary operation mode switching signals OTS1 and /OTS1, OTS2 and /OTS2, and OTS3 and /OTS3 to output a reference level RL.

Now, an example of an action of the reference level trimming circuit in a semiconductor device temperature sensor in association with the invention will be described.

First, the chip temperature is set to a test temperature for a high temperature test (e.g. 90-100° C.). At this point, the level RefHT is selected in the reference level switching unit 45 and then the transition to the high temperature test mode (high temperature measuring mode) is made. Specifically, paired operation mode switching signals OTS3 and /OTS3 are made High level "H" and Low level "L" to turn on only the transfer gate 453 and then output the level RefHT as a reference level RL.

In this condition, the high-temperature reference level trimming unit 42 is used to perform adjustment of the reference level. That is, the corrected reference level VrHT, which is output from the high-temperature reference level trimming unit 42, is made to pass through the high-temperature voltage follower 44 and output as a level RefHT. The level RefHT output from the high-temperature voltage follower 44 is output as a high-temperature reference level because the level RefHT has been selected in the reference level switching unit 45.

At this point, the reference level RL output from the reference level switching unit 45 is compared with the monitor level ML derived from the series connection of the diode 152 and resistor 151 by the differential amplifier 153 in the temperature-detection circuit 15, which has been described with reference to FIG. 10. Then, when the monitor level ML is above the reference level RL, i.e. when the actual chip temperature is lower than the preset temperature, the detected temperature signal TS is made High level "H," and conversely when the monitor level ML is below the reference level RL, i.e. when the actual chip temperature is higher than the preset temperature, the detected temperature signal TS is made Low level "L."

As for the detected temperature signal TS, if the actual chip temperature is lower than the preset temperature when the signature enable signal SE is made High level "H," current will be output to the pad 17. The ON/OFF switching point of the current is an intersecting point of the monitor level ML and reference level RL, which is a trimming correction point of the high-temperature reference level trimming unit 42. In the time of a high temperature test, the test mode is used and the transfer gates (422-1 to 422-n) are turned on sequentially one by one in the high-temperature reference level trimming unit 42 thereby to search for and record the ON/OFF switching point of the current passing through the pad 17.

Next, the chip temperature is set to a test temperature for a low temperature test (e.g. 20-30° C.). At this point, the level RefLT is selected in the reference level switching unit 45 and then the transition to the low temperature test mode (low temperature measuring mode) is made. Specifically, paired operation mode switching signals OTS1 and /OTS1 are made High level "H", and Low level "L" to turn on only the transfer gate 451 and then output the level RefLT as a reference level RL.

In this condition, the low-temperature reference level trimming unit 41 is used to perform adjustment of the reference level. That is, the corrected reference level VrLT, which is output from the low-temperature reference level trimming unit 41, is made to pass through the low-temperature voltage follower 43 and output as a level RefLT. The level RefLT output from the low-temperature voltage follower 43 is output as a low-temperature reference level because the level RefLT has been selected in the reference level switching unit 45.

At this point, the reference level RL output from the reference level switching unit 45 is compared with the monitor level ML derived from the series connection of the diode 152 and resistor 151 by the differential amplifier 153 in the temperature-detection circuit 15. Then, when the monitor level ML is above the reference level RL, i.e. when the actual chip temperature is lower than the preset temperature, the detected temperature signal TS is made High level "H," and conversely when the monitor level ML is below the reference level RL, i.e. when the actual chip temperature is higher than the preset temperature, the detected temperature signal TS is made Low level "L."

As for the detected temperature signal TS, if the actual chip temperature is lower than the preset temperature when the signature enable signal SE is made High level "H," current will be output to the pad 17. The ON/OFF switching point of the current is an intersecting point of the monitor level ML and reference level RL, which is a trimming correction point of the low-temperature reference level trimming unit 41. In the time of a low temperature test, the test mode is used and the transfer gates (412-1 to 412-n) are turned on sequentially one by one in the low-temperature reference level trimming unit 41 thereby to search for and record the ON/OFF switching point of the current passing through the pad 17.

Further, fuses of the trimming points, which have been found out in the above-described high temperature test and low temperature test, are cut individually. That is, the fuse 115 in the fuse circuit 11, which has been described with reference to FIG. 5, is cut by fusion. This brings RefHT/RefLT to a level after the offset correction of the temperature-detection circuit 15 and the monitor level temperature dependency correction have been done. As a result, a voltage resulting from the voltage division by the resistors Ra and Rb connected in series between RefHT and RefLT of the reference level switching unit 45, and the resistor RL reflects the temperature dependency of the monitor level.

Finally, the level RefDET is selected in the reference level switching unit 45, whereby the transition to a normal operation mode is performed. Specifically, paired operation mode switching signals OTS2 and /OTS2 are made High level "H" and Low level "L" to turn on only the transfer gate 452 and then output the level RefDET as a reference level RL. At this point, it becomes possible to detect the temperature with high accuracy because the reference level RL derived from the resistance division by the resistors Ra, Rb and RL of the reference level switching unit 45 has reached a level after the trimming correction.

Figure 16:
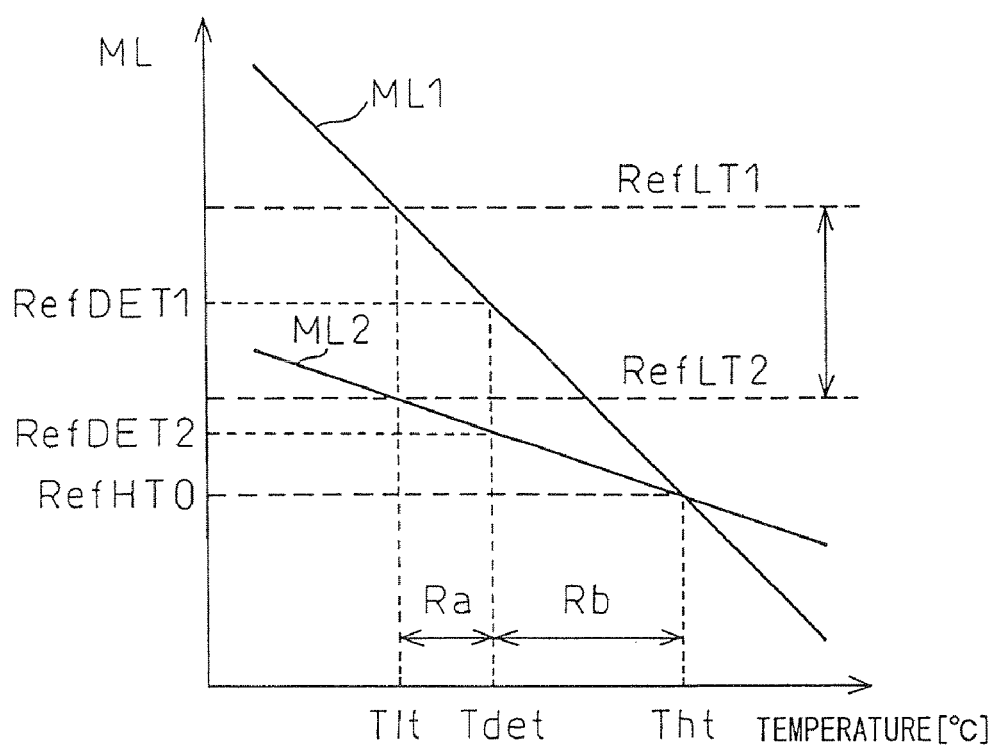
FIG. 16 is a diagram explaining an action of the reference level trimming circuit shown in FIG. 14.

FIG. 16 is a diagram explaining an action of the reference level trimming circuit shown in FIG. 14, which shows the case where the monitor level ML in the temperature-detection circuit 15 varies between ML1 and ML2. Here, in FIG. 16 is shown the case where the monitor levels ML1 and ML2 are coincident at the temperature Tht of the high temperature test (RefHT0), and at the temperature Tlt of the low temperature test RefLT1 and RefLT2 differ largely.

Concretely, for example, when the ratio of the resistors Ra and Rb in the reference level switching unit 45 of the reference level trimming circuit 14 shown in FIG. 14 is Ra:Rb=1: 2, the temperature detected by the temperature-detection circuit 15 (detected temperature) Tdet falls at a location of 1:2 between the test temperature Tlt for a low temperature test and the a test temperature Tht for a high temperature test. Because the detected temperature Tdet depends on the ratio of the test temperature Tlt for a low temperature test to the test temperature Tht for a high temperature test, even when the temperature dependency of the monitor level of the temperature-detection circuit 15 varies, such variation can be corrected by trimming of the aforementioned levels RefHT and RefLT. In regard to RL, it is necessary that the following relation holds: RL/(Ra+Rb+RL)<RefHt/RefLT.

In the manner as stated above, a semiconductor device temperature sensor of the invention enables the improvement of accuracy of the detected temperature by performing the trimming of high-temperature and low-temperature reference levels in a high temperature test and low temperature test and then creating other temperatures by division of resistance.

Further, when the semiconductor device temperature sensor is applied to a semiconductor storage device such as a DRAM, which needs to be refreshed for data holding, electric power consumption can be reduced by appropriately controlling the cycle of the refresh action.

In the above description, as for the priorities of the low temperature test and high temperature test, either test may take priority. In addition, there is no need to cut the fuses at a time, and they may be cut after high temperature and low temperature tests respectively. Further, a reference level for temperature detection is produced from two reference levels on the sides of low and high temperatures in the above embodiment. However, in this regard, it is also possible to produce a reference level for temperature detection from three or more reference levels of different temperatures and then perform the temperature detection. Further, for example, by not carrying out the above-described high temperature test and low temperature test as temperature tests only for the semiconductor device temperature sensor, but diverting another temperature test, the cost for the tests can be cut down.

The present invention is applicable to a semiconductor device temperature sensor. Particularly, the present invention can be widely applied as a temperature sensor for various semiconductor devices capable of detecting a temperature with high accuracy to carry out a predetermined control, including a semiconductor storage device such as a DRAM, which controls the cycle of a refresh action of a memory unit by an output of a temperature sensor.

What is claimed is:

1. A semiconductor device including a temperature sensor performing temperature detection using a reference level for temperature detection,
    wherein the reference level for temperature detection is produced from two adjustable reference levels composed of a low-temperature reference level and high-temperature reference level, and
    wherein the reference level for temperature detection is derived from resistance division of the high-temperature reference level and the low-temperature reference level.

2. The semiconductor device as claimed in claim 1, further comprising:
    a resistance array,
        wherein one end of the resistance array is supplied with the low-temperature level and the other end of the resistance array is supplied with the high-temperature level.

3. The semiconductor device as claimed in claim 1, further comprising:
    a reference level switching unit that selects one from a group of consisting of the high-temperature reference level, the low-temperature reference revel and a reference level derived from the resistance division.

4. The semiconductor device as claimed claim 1, wherein the reference level derived from the resistance division is selected in a normal mode and one of the high-temperature reference level and the low-temperature reference level is selected in a test mode.

5. The semiconductor device as claimed in claim 1, further comprising:
    a high-temperature reference level portion that generates the high-temperature level based on a basic reference and a selection signal; and
    a low-temperature reference level portion that generates the low-temperature level based on the basic reference and the selection signal.

6. The semiconductor device as claimed in claim 5, wherein the selection signal is generated based on a fuse signal.

7. The semiconductor device as claimed in claim 6, further comprising:
    a fuse circuit that generates the fuse signal; and
    a selector circuit that outputs at least one of the fuse signal and a test code based on a test mode signal.

8. The semiconductor device as claimed in claim 1, wherein a correction is performed on the high-temperature reference level and the low-temperature reference level by a trimming based on the temperature detection.

9. A semiconductor device including a temperature sensor performing temperature detection using a reference level for temperature detection,
    wherein the reference level for temperature detection is produced from two adjustable reference levels composed of a low-temperature reference level and high-temperature reference level, and
    wherein the reference level for temperature detection is derived from a resistance array, one end of the resistance array is supplied with the high-temperature reference level, and the other end of the resistance array is supplies with the low-temperature reference level.

10. The semiconductor device as claimed in claim 9, further comprising:
    a reference level switching unit that selects one reference level obtained from a plurality node of the resistance array.

11. The semiconductor device as claimed in claim 10, further comprising:
    a fuse circuit that includes a fuse is cut or is not cut based on the selection of one of the high-temperature reference level and the low-temperature reference level.

12. The semiconductor device as claimed in claim 9, wherein a first trimming on the high-temperature reference level is performed when selecting the high-temperature reference level as the reference level for temperature detection, and a second trimming on the low-temperature reference level is performed when selecting the low-reference temperature as the reference level for temperature detection.

13. The semiconductor device as claimed in claim 12, wherein a resistance division level is derived as the reference level for temperature detection after the first trimming and the second trimming.

* * * * *